(12) United States Patent
Eickelmann et al.

(10) Patent No.: US 10,741,710 B2
(45) Date of Patent: Aug. 11, 2020

(54) THIN FILM PHOTOVOLTAIC CELL WITH BACK CONTACTS

(71) Applicant: INTERNATIONAL BUSINESS MACHINES CORPORATION, Armonk, NY (US)

(72) Inventors: Hans-Juergen Eickelmann, Nieder-Hilbersheim (DE); Ruediger Kellmann, Mainz (DE); Hartmut Kuehl, Gau-Bischofsheim (DE); Markus Schmidt, Seibersbach (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/820,524

(22) Filed: Nov. 22, 2017

(65) Prior Publication Data

US 2018/0102450 A1   Apr. 12, 2018

Related U.S. Application Data

(63) Continuation of application No. 14/751,276, filed on Jun. 26, 2015, now Pat. No. 9,859,451.

(51) Int. Cl.
*H01L 31/04* (2014.01)
*H01L 31/0465* (2014.01)
(Continued)

(52) U.S. Cl.
CPC .... *H01L 31/0465* (2014.12); *H01L 31/02167* (2013.01); *H01L 31/02327* (2013.01);
(Continued)

(58) Field of Classification Search
CPC .............................. H01L 31/18; H01L 31/0326
See application file for complete search history.

(56) References Cited

U.S. PATENT DOCUMENTS

| 5,789,766 A * | 8/1998 | Huang ................. H01L 27/156 |
| | | 257/83 |
| 8,748,217 B2 | 6/2014 | Lin et al. |

(Continued)

OTHER PUBLICATIONS

John, Dr. Joachim, "PercIGS: Development of Rear Surface Passivated Cu (in, Ga) Set (CIGS) Solar Cells", De Zwarte Doos, Eindhoven University of Technology, Nanomanufacturing: ALD4PV, Mar. 20, 2014 (22 pages).

(Continued)

*Primary Examiner* — Caridad Everhart
*Assistant Examiner* — Ankush K Singal
(74) *Attorney, Agent, or Firm* — Tihon Poltavets, Esq.; Kevin P. Radigan, Esq.; Heslin Rothenberg Farley & Mesiti P.C.

(57) ABSTRACT

Photovoltaic cells, photovoltaic devices, and methods of fabrication are provided. The photovoltaic cells include a transparent substrate to allow light to enter the photovoltaic cell through the substrate, and a light absorption layer associated with the substrate. The light absorption layer has opposite first and second surfaces, with the first surface being closer to the transparent substrate than the second surface. A passivation layer is disposed over the second surface of the light absorption layer, and a plurality of first discrete contacts and a plurality of second discrete contacts are provided within the passivation layer to facilitate electrical coupling to the light absorption layer. A first electrode and a second electrode are disposed over the passivation layer to contact the plurality of first discrete contacts and the plurality of second discrete contacts, respectively. The first and second electrodes may include a photon-reflective material.

15 Claims, 5 Drawing Sheets

(51) Int. Cl.
*H01L 31/0445* (2014.01)
*H01L 31/0224* (2006.01)
*H01L 31/18* (2006.01)
*H01L 31/0392* (2006.01)
*H01L 31/0216* (2014.01)
*H01L 31/0232* (2014.01)
*H01L 31/032* (2006.01)

(52) U.S. Cl.
CPC .. *H01L 31/022441* (2013.01); *H01L 31/0322* (2013.01); *H01L 31/0326* (2013.01); *H01L 31/0392* (2013.01); *H01L 31/0445* (2014.12); *H01L 31/18* (2013.01); *H01L 31/1828* (2013.01); *H01L 31/1868* (2013.01); *Y02E 10/50* (2013.01)

(56) References Cited

U.S. PATENT DOCUMENTS

| | | | |
|---|---|---|---|
| 8,816,192 | B1 | 8/2014 | Walitzki |
| 8,829,342 | B2 | 9/2014 | Compaan et al. |
| 8,852,989 | B2 | 10/2014 | Van Duren et al. |
| 9,041,133 | B2 | 5/2015 | Oganesian |
| 9,246,024 | B2 | 1/2016 | Fisher et al. |
| 9,634,166 | B2 | 4/2017 | Eickelmann et al. |
| 10,236,401 | B2 | 3/2019 | Higuchi et al. |
| 2001/0006528 | A1 | 7/2001 | Sato et al. |
| 2004/0056590 | A1 | 3/2004 | Lim et al. |
| 2005/0223570 | A1 | 10/2005 | Yonezawa et al. |
| 2005/0268963 | A1 | 12/2005 | Jordan et al. |
| 2007/0289623 | A1 | 12/2007 | Atwater et al. |
| 2008/0072953 | A1* | 3/2008 | Stephens ......... H01L 31/022441 136/249 |
| 2009/0001386 | A1 | 1/2009 | Koda et al. |
| 2009/0145472 | A1 | 6/2009 | Li et al. |
| 2009/0323750 | A1 | 12/2009 | Inoue et al. |
| 2010/0000589 | A1 | 1/2010 | Kiss et al. |
| 2010/0108130 | A1 | 5/2010 | Ravi |
| 2010/0108134 | A1 | 5/2010 | Ravi |
| 2010/0176475 | A1 | 7/2010 | Sano |
| 2010/0326429 | A1 | 12/2010 | Cumpston et al. |
| 2011/0061729 | A1 | 3/2011 | Lee et al. |
| 2012/0037216 | A1* | 2/2012 | Kim ......................... H01B 1/22 136/252 |
| 2012/0146067 | A1 | 6/2012 | Unno et al. |
| 2012/0167966 | A1 | 7/2012 | Hu et al. |
| 2012/0211072 | A1 | 8/2012 | Kim et al. |
| 2012/0240998 | A1 | 9/2012 | Ballif et al. |
| 2012/0260978 | A1 | 10/2012 | Korevaar et al. |
| 2013/0092224 | A1* | 4/2013 | Lee ................... H01L 31/02244 136/256 |
| 2013/0118569 | A1 | 5/2013 | Lee et al. |
| 2013/0133729 | A1 | 5/2013 | Mo et al. |
| 2013/0269762 | A1* | 10/2013 | Cui ................... H01L 31/03523 136/255 |
| 2013/0284253 | A1 | 10/2013 | Krasnov et al. |
| 2013/0306145 | A1* | 11/2013 | Hanawa .................. C03C 3/087 136/256 |
| 2014/0020757 | A1 | 1/2014 | Hasegawa et al. |
| 2014/0053889 | A1 | 2/2014 | Huang et al. |
| 2014/0077221 | A1 | 3/2014 | Genei et al. |
| 2014/0083502 | A1 | 3/2014 | Wu et al. |
| 2014/0102509 | A1 | 4/2014 | Eickelmann et al. |
| 2014/0109963 | A1 | 4/2014 | Chung et al. |
| 2014/0216543 | A1* | 8/2014 | Sugimoto ....... H01L 31/022441 136/256 |
| 2014/0238475 | A1 | 8/2014 | Hu et al. |
| 2014/0252406 | A1 | 9/2014 | Baisl et al. |
| 2015/0020864 | A1 | 1/2015 | Dufourcq et al. |
| 2015/0020877 | A1 | 1/2015 | Moslehi et al. |
| 2015/0053259 | A1 | 2/2015 | Hardin et al. |
| 2015/0228834 | A1 | 8/2015 | Masuda et al. |
| 2015/0372159 | A1 | 12/2015 | Englund et al. |
| 2016/0147125 | A1 | 5/2016 | Theodore et al. |
| 2016/0181452 | A1 | 6/2016 | Hsieh et al. |
| 2016/0380133 | A1 | 12/2016 | Eickelmann et al. |
| 2017/0236965 | A1* | 8/2017 | Ring ................. H01L 31/02242 438/83 |
| 2018/0248065 | A1 | 8/2018 | Chang et al. |
| 2019/0296169 | A1 | 9/2019 | Paire et al. |

OTHER PUBLICATIONS

Vermang et al., "Employing Si Solar Cell Technology to Increase Efficiency of Ultra-Thin Cu(In,Ga)Se2 Solar Cells", Progress in Photovoltaics: Research and Applications, Mar. 2014 (7 pages).

Schmidt et al., "All Back Contact Thin Film Solar Cell in Substrate Configuration", IBM Germany (2014) (3 pages).

Eickelmann et al., "List of IBM Patents or Patent Applications Treated as Related", U.S. Appl. No. 15/820,524, filed Nov. 22, 2017, dated Dec. 20, 2017 (2 pages).

* cited by examiner

THIN FILM PHOTOVOLTAIC CELL WITH BACK CONTACTS

BACKGROUND

A thin film solar cell (TFSC) or thin film photovoltaic cell (TFPV) is a second generation solar cell made by depositing one or more thin layers, or thin films (TFs), of light absorption material on a substrate, such as a glass, plastic or metal substrate. Thin film solar cells are commercially used in several technologies, including cadmium telluride (CdTe), copper-indium-gallium-selenide (CIGS), and amorphous and other thin film silicon (a-Si, TF-Si). There are other second generation thin film photovoltaic cell technologies that are in early stage of research. These include copper-zinc-tin-sulfide (CZTS) and Perovskite solar cells.

Film thicknesses can vary from a few nanometers to tens of micrometers, much thinner than the conventional, first generation crystalline silicon solar cell (c-Si), which typically utilize silicon wafers of, for instance, 200 micrometers thickness or greater. This difference advantageously allows thin film photovoltaic cells to be flexible, lower in weight, and have less drag compared with first generation solar cells.

In order for thin film photovoltaic cell technology to make further advances in the marketplace, improved thin film photovoltaic cell designs are desired, with reduced recombination losses and reduced contact resistances. There is also a need for reduced absorber material thicknesses to increase manufacturing throughput of the thin film photovoltaic cell, such as with, for instance, CIGS, CZTS, Perovskite, etc., solar cells.

SUMMARY

The shortcomings of the prior art are overcome and additional advantages are provided through the provision of a photovoltaic cell, which includes, for instance: a substrate, the substrate being, at least in part, transparent to allow light to enter the photovoltaic cell through the substrate; a light absorption layer associated with the substrate, the light absorption layer having opposite first and second surfaces, the first surface being closer to the substrate than the second surface; a passivation layer disposed over the second surface of the light absorption layer; a plurality of first discrete contacts and a plurality of second discrete contacts, the plurality of first discrete contacts and the plurality of second discrete contacts both residing, at least in part, within the passivation layer, and facilitating electrical coupling to the light absorption layer; and a first electrode and a second electrode disposed over the passivation layer, the first electrode contacting the plurality of first discrete contacts and the second electrode contacting the plurality of second discrete contacts.

In another aspect, a photovoltaic device is provided which includes a photovoltaic cell. The photovoltaic cell includes, for instance: a substrate, the substrate being, at least in part, transparent to allow light to enter the photovoltaic cell through the substrate; a light absorption layer associated with the substrate, the light absorption layer having opposite first and second surfaces, the first surface being closer to the substrate than the second surface; a first surface passivation layer and a second surface passivation layer, the first surface passivation layer being disposed over the first surface of the light absorption layer, between the substrate and the light absorption layer, and the second surface passivation layer being disposed over the second surface of the light absorption layer; a plurality of first discrete contacts and a plurality of second discrete contacts, the plurality of first discrete contacts and the plurality of second discrete contacts both residing, at least in part, within the second surface passivation layer, and facilitating electrical coupling to the light absorption layer; and a first electrode and a second electrode disposed over the second surface passivation layer, the first electrode contacting the plurality of first discrete contacts, and the second electrode contacting the plurality of second discrete contacts.

In a further aspect, a method is presented which includes fabricating a photovoltaic cell. The fabricating includes: providing a substrate, the substrate being, at least in part, transparent to allow light to enter the photovoltaic cell through the substrate; providing a light absorption layer in association with the substrate, the light absorption layer having opposite first and second surfaces, the first surface being closer to the substrate than the second surface; disposing a passivation layer over the second surface of the light absorption layer; forming a plurality of first discrete contacts and a plurality of second discrete contacts within, at least in part, the passivation layer to electrically couple to the light absorption layer; and providing a first electrode and a second electrode disposed over the passivation layer, the first electrode electrically contacting the plurality of first discrete contacts, and the second electrode electrically contacting the plurality of second discrete contacts.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

As understood in the art, photovoltaics generally refers to converting solar energy into direct current electricity using semiconductor materials that exhibit the photovoltaic effect. A photovoltaic system employs solar panels comprising a number of photovoltaic cells to supply usable solar power. Current second generation solar or photovoltaic cells employ thin film semiconductor materials as the solar absorber or light absorption layer. A number of semiconductor materials have been proposed or used in thin film solar cells, including copper-indium-gallium-selenide (CIGS), copper-zinc-tin-sulfide/selenide (CZTS), and organic- or inorganic-Perovskite, along with others. Conventional thin film photovoltaic cells include an absorber material disposed between an ohmic contact and a transparent contact, which allows light to reach the absorber layer.

One way to reduce cost of energy for photovoltaic cell systems is to improve efficiency of the device. Proper identification and elimination of loss mechanisms, while optimizing the cost of the manufacturing of the device, can lead to further cost reduction and aid in scaling of the levelized cost of electricity (LCOE) of the technology, while the solar industry is ramping up manufacturing capacity into the multi-GW-scale. One large contribution to losses is recombination at the front and back-side surfaces of the light absorber to the front and back contacts, respectively. A need therefore continues to exist for improved thin film solar cell designs with reduced recombination losses, and for thin absorbers with reduced contact resistance. In addition, there is a need to reduce absorber thickness to increase manufacturing throughput in thin film solar cell manufacturing of certain photovoltaic cells, such as CIGS/CZTS cells.

Typically, for thin film solar cells, the back-side contact as well as the front-side contact are continuous, stratified media. Transparent conducting oxides, used as a front surface cell contact, and window layers, such as CdS are often responsible for ohmic losses and optical losses. Also, monolithic integration of absorber segments leads to losses at segmentation scribes.

Presented herein are thin film photovoltaic cells with both contacts (or types of contacts) to the light absorption layer on the same side of the absorber. This advantageously allows separate optimization of the optical design, and electrical design. The configurations disclosed herein remove the requirement for a transparent conducting oxide (TCO) layer, and allow for improved passivation of the light absorption surfaces, while also allowing for simplified electrical interconnection of the cells. This is achieved, in part, by structuring nano-sized discrete contacts or vias into and through a common passivation layer on one side of the absorber to provide both ohmic, as well as rectifying, contacts to the absorber material. In other embodiments, the different contacts may be charge-carrier selective contacts. Advantageously, disclosed herein are thin film solar devices, such as CIGS, CZTS, Perovskite cells, etc., with an all back-side contact approach using nano-sized point contacts. Note that "front-side" in this context refers to the side light enters through, while "back-side" refers to the opposite side.

The back-side-only photovoltaic cells and manufacturing methods disclosed address numerous goals, including, for instance, reducing the thickness of the thin film light absorption layer (i.e., the thin film solar absorber), reducing surface recombination, and increasing photovoltaic cell efficiency.

Generally stated, disclosed herein are photovoltaic cells (and methods of fabrication thereof) which include: a substrate, and a light absorption layer which comprises, for instance, a thin film light absorption semiconductor material. The substrate is transparent to allow light (such as visible light) to enter the photovoltaic cell through the substrate, and the semiconductor material may have a thickness of 5 microns or less, for instance, the material may have a thickness in the range of 0.5-2 microns. The light absorption layer has opposite first and second surfaces, with the first surface being closer to the substrate than the second surface. A passivation layer is disposed over the second surface of the light absorption layer, and a plurality of first discrete contacts and a plurality of second discrete contacts are provided within the passivation layer, arrayed in any desired configuration. The first and second discrete contacts are different sets of different types of sub-micrometer point contacts, which are distributed within the thin passivation layer and which facilitate electrical connection to the light absorption layer, as explained further herein. In addition, a first electrode and a second electrode are provided over the passivation layer to electrically contact the plurality of first discrete contacts and the plurality of second discrete contacts, respectively. The first and second electrodes may advantageously comprise a photon-reflective material, which forms the backside of the photovoltaic cell.

In certain embodiments, the semiconductor material of the light absorption layer may comprise a second or later-generation material, such as copper-indium-gallium-selenide (CIGS), copper-zinc-tin-sulfide/selenide (CZTS), organic- or inorganic-Perovskite, by way of example only.

In one or more implementations, the passivation layer is a second surface passivation layer (which resides over the second surface of the light absorption layer), and the photovoltaic cell may also include a first surface passivation layer disposed over the first surface of the light absorption layer, between the substrate and the light absorption layer. By way of example, the first surface passivation layer and the second surface passivation layer may comprise a common passivation material, such as aluminum oxide, as one example.

In certain implementations, the plurality of first discrete contacts may comprise a plurality of heterojunction-type discrete contacts (or vias) to the light absorption layer, and the plurality of second discrete contacts may comprise a plurality of ohmic-type discrete contacts (or vias) to the light absorption layer. For instance, the light absorption layer may comprise a semiconductor material, such as one or more of the above-noted second generation or later materials, and the plurality of heterojunction-type discrete contacts may each comprise a buffer material and a transparent conducting oxide, and the plurality of ohmic-type discrete contacts may comprise discrete metal contacts to the light absorption layer. By way of example, the first and second discrete contacts may each be sub-micrometer-sized, for instance, 500 nanometers or less. More particularly, the discrete contacts may have a characteristic dimension in the range of 100-500 nanometers, and (in certain embodiments) be distributed in spaced rows over the light absorption layer. By way of example, the plurality of first discrete contacts and the plurality of second discrete contacts may reside entirely within the passivation layer (i.e., the second surface passivation layer), and comprise surfaces that are coplanar with a surface of the passivation layer. For instance, upper surfaces of the first and second discrete contacts may be coplanar with an upper surface of the passivation layer over which the electrodes are provided.

As a specific example, the first electrode and the second electrode may include interdigitated first and second conductive lines respectively disposed over corresponding rows of the pluralities of first and second discrete contacts. Note also that the first and second electrodes may be, in one or more embodiments, sized to cover or overlie a majority of the passivation layer, and thus, overlie a majority of the light absorption layer of the photovoltaic cell. For instance, the first and second electrodes may cover 90% or more of the passivation and light absorption layers. In one implementation, the first and second electrodes are formed from a metal layer that overlies all of the passivation layer and light absorption layer, with the electrodes being separated by a thin scribe, which in certain embodiments, may be on the order of a micron or less, and thus, most all of the passivation and light absorption layers are covered by the electrodes. As noted, these electrodes may advantageously comprise a photon-reflective material, such as silver or aluminum.

To restate, presented herein are photovoltaic cells or solar cells and manufacturing processes, and particularly, for instance, CIGS/CZTS/organic- or inorganic-Perovskite, etc., thin film photovoltaic cells. The design of the cell is such that the necessary contacts are formed on a common side of the cell's absorber absorption layer. Further, in certain embodiments, the light absorption layer may be fully enclosed by passivation layers, that is, have passivation layers covering its opposite first and second surfaces. Light may enter into the photovoltaic cell through a transparent substrate, and be reflected by a highly reflecting electrode layer disposed outside the passivating layers to reduce cell absorption losses. Interdigitated electrodes, such as interdigitated back-side electrodes, provide electrical contact to the solar cell. The back-side electrodes are electrically connected via discrete contacts, such as conductive vias, to the absorber layer. The interfaces to a p-type absorber layer may be functionalized by n-type doping and ohmic contacts. The contacts have a pitch of, for instance, 100 nm-5000 nm, between adjacent rows of the different types of discrete contacts, and contact openings may be, for instance, 100-500 nm, in accordance to the requirements of the lifetime of minority charge carriers in the cell's light absorption material.

Reference is made below to the drawings, which are not drawn to scale for ease of understanding, wherein the same reference numbers used throughout different figures designate the same or similar components.

Figure 1:
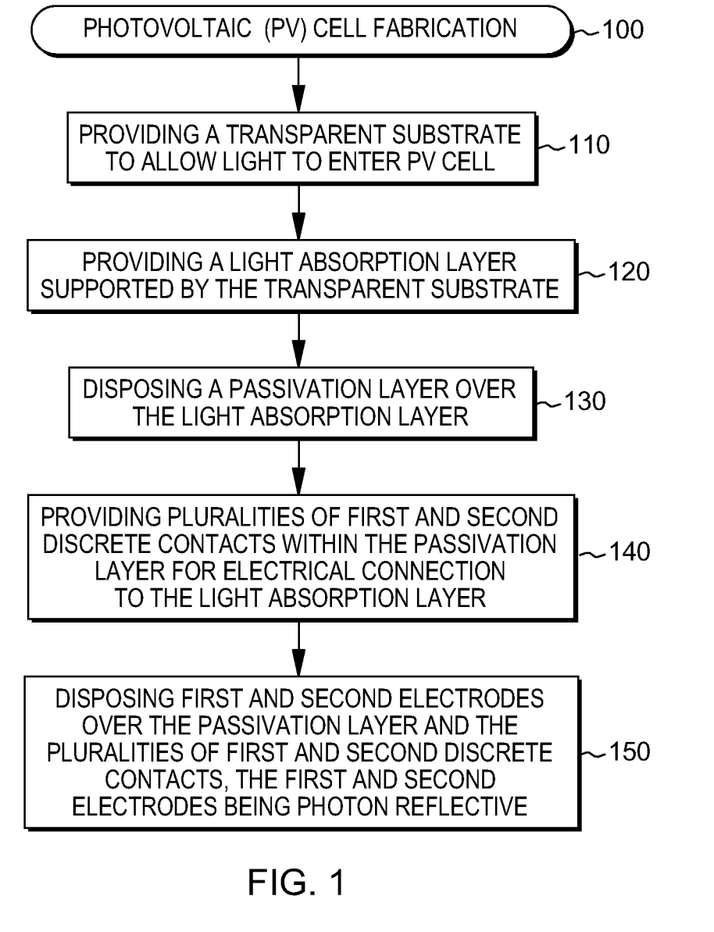
FIG. 1 depicts one embodiment of a process of fabricating a photovoltaic cell, in accordance with one or more aspects of the present invention.

FIG. 1 illustrates one embodiment of a photovoltaic cell fabrication process 100, in accordance with one or more aspects of the present invention. The fabrication process 100 includes providing a transparent substrate to allow light to enter the photovoltaic cell 110, and providing a light absorption layer, such as a thin film semiconductor materials, in association with the transparent substrate 120. Note in this regard, that although describing fabricating a photovoltaic cell, those skilled in the art will understand that the process discussed may be employed to manufacture in parallel a plurality of photovoltaic cells for, for instance, a solar panel or other solar device.

The fabricating further includes disposing a passivation layer over the light absorption layer 130, and providing separate pluralities of first and second discrete contacts within the passivation layer to facilitate electrical connection to the light absorption layer 140. First and second electrodes are then disposed over the passivation layer and the first and second discrete contacts 150. The first and second electrodes may cover a majority of the photovoltaic cell and be fabricated of a conductive material that is photon-reflective to further enhance cell performance.

FIGS. 2A-2I depict one detailed embodiment of the above-noted process for fabricating a photovoltaic cell, in accordance with one or more aspects of the present invention.

Figure 2A:
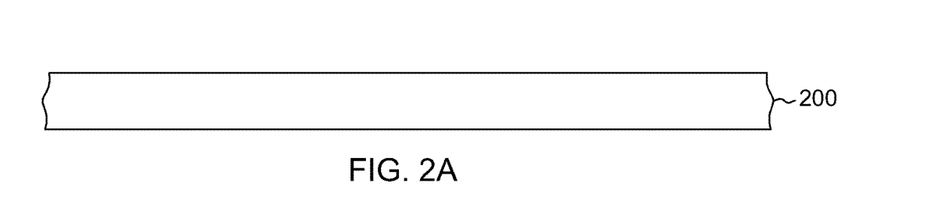
FIGS. 2A-2I depict one detailed embodiment of an exemplary photovoltaic cell being fabricated, in accordance with one or more aspects of the present invention.

Referring to FIG. 2A, a substrate 200 is provided that is, at least in part, transparent to allow light to enter the photovoltaic cell through substrate 200. As examples, substrate 200 may comprise a glass substrate, a transparent foil substrate, etc.

Figure 2B:
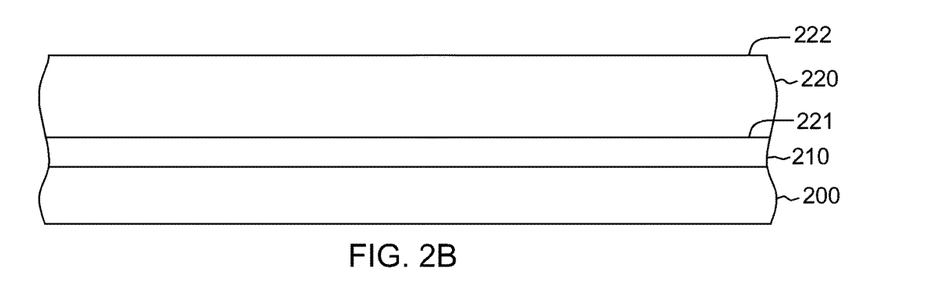

FIG. 2B depicts the structure of FIG. 2A, after provision of a first surface passivation layer 210 and a light absorption layer 220 over substrate 200. As shown, light absorption layer 220 includes opposite first and second surfaces 221, 222, and first surface passivation layer shown disposed over (or covering) first surface 221 of light absorption layer 220, between light absorption layer 220 and substrate 200. Note that in alternate configurations, multiple passivating layers may be provided between light absorption layer 220 and substrate 200, or no layers may be provided, in which case light absorption layer 220 may reside directly on substrate 200.

By way of example, first surface passivation layer 210 may be deposited over substrate 200 using, for instance, atomic layer deposition, sputtering, etc. Exemplary materials for passivation layer 210 include $Al_2O_3$, $MgF_2$, etc. Light absorption layer 220 may be formed of a semiconductor material which is light-absorbing. By way of example, the light-absorbing material could comprise copper-indium-gallium-selenide/sulfide (CIGS), copper-zinc-tin-sulfide (CZTS), organic- or inorganic-Perovskite, etc., and be deposited using, for instance, co-evaporation or sputtering processes.

Figure 2C:
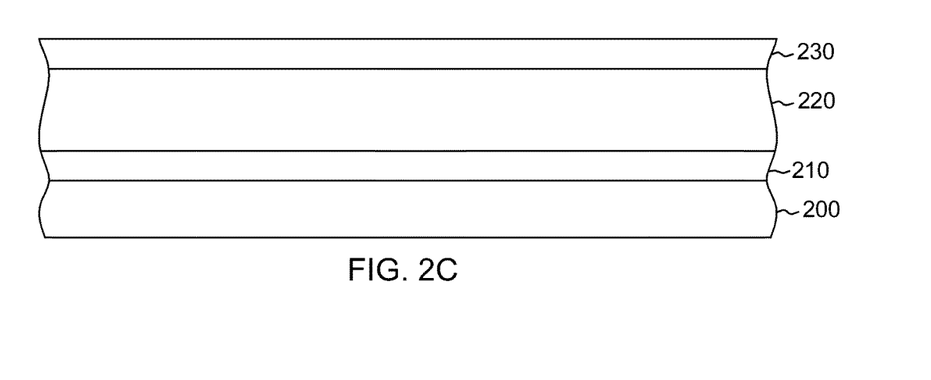

A second surface passivation layer 230 may be deposited over the second surface 222 of light absorption layer 220, as illustrated in FIG. 2C. In one or more implementations, second surface passivation layer 230 may be an antireflective and passivating layer, and may comprise, for instance, $Al_2O_3$, $MgF_2$, or other passivating material(s). Note that thicknesses of the layers in the stack of FIG. 2C may be provided, as desired. By way of example, substrate 200 may have a thickness of 100-200 microns. First surface passivation layer 210 may have a thickness in the range of 5-15 nanometers, light absorption layer 220 may have a thickness less than 5 microns, for instance, in the range of 0.5-2 microns, and second surface passivation layer 230 may have a thickness in the range of 5-15 nanometers. Note that the thicknesses of the passivation layers 210, 230 may be the same, or different, as may be the material forming the passivating layers.

Figure 2D:
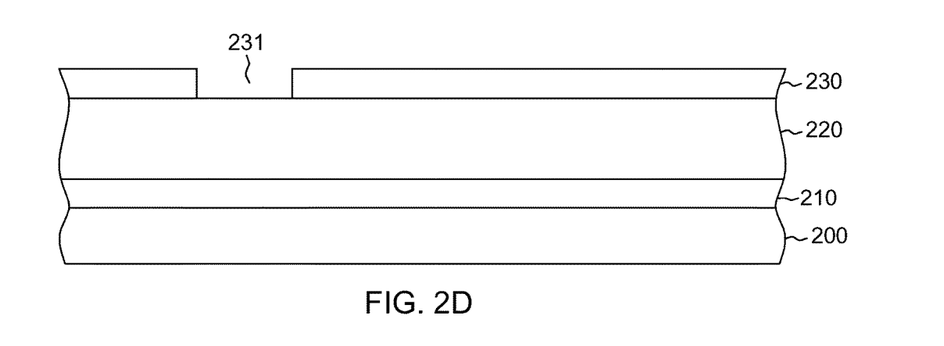

As illustrated in FIG. 2D, second surface passivation layer 230 is patterned with a plurality of first contact openings 231 extending through second surface passivation layer 230, to light absorption layer 220. The plurality of first contact openings 231 may be formed by depositing a first sacrificial layer (not shown), such as a polymer, over second surface passivation layer 230, nano-printing openings in the first sacrificial layer for the plurality of first contact openings, and then etching second surface passivation layer 230 to provide the plurality of first contact openings 231 in the desired contact size and pattern. As noted, the resultant discrete contacts being formed are, in one or more embodiments, each sub-micrometer-sized, for instance, 500 nanometers or less. Thus, the first contact openings 231 are each formed with a desired characteristic dimension. For instance, if circular-shaped, the first contact openings may have a diameter in the range of 100-500 nanometers, in certain implementations.

Figure 2E:
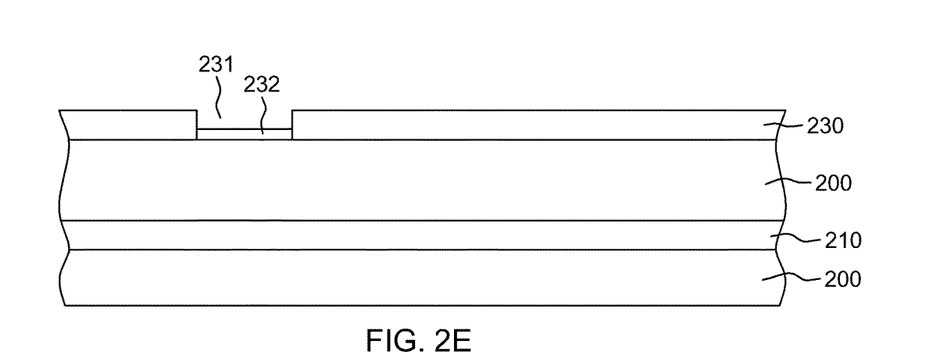

As illustrated in FIG. 2E, a thin layer of buffer material 232 may be deposited within the first contact openings 231, after which the first sacrificial layer (not shown) may optionally be removed. By way of example, buffer material 232 may comprise CdS.

Figure 2F:
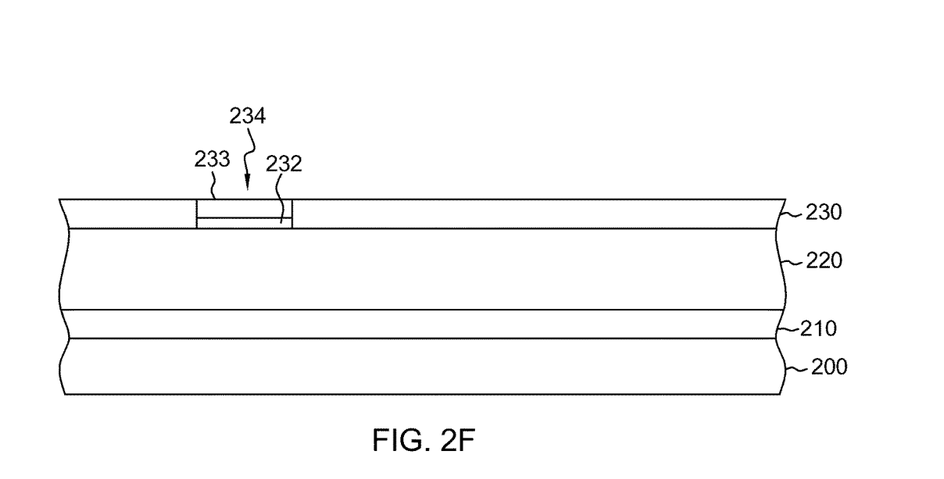

As shown in FIG. 2F, a plurality of heterojunction-type discrete contacts 234 may be formed by depositing, for instance, a transparent, conducting oxide, such as ZnO 233, within the first contact openings 231 (FIG. 2E) over buffer material 232. Note that many combinations of materials may be utilized in providing the first discrete contacts 234 within second surface passivation layer 230, with the noted material combination being provided by way of example only. For instance, alternatively, cadmium-free sputtered ZnOS may be employed in forming the plurality of heterojunction-type contacts. If not already removed, then after forming first discrete contacts 234, the first sacrificial layer (not shown) may be removed. Note that alternatively, cadmium-free sputtered ZnOS may be employed in forming the plurality of heterojunction contacts.

Figure 2G:
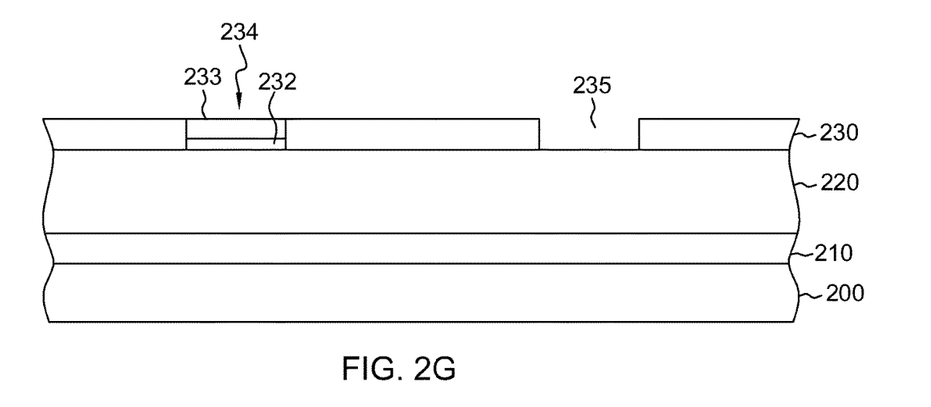

A second sacrificial layer (not shown) may subsequently be provided over second surface passivation layer 230 and first discrete contacts 234, and nano-printed for forming second contact openings 235 for the plurality of second discrete contacts. Specifically, after nano-printing the second sacrificial layer (not shown), the plurality of second discrete contact openings 235 may be formed by etching second surface passivation layer 230 using the patterned second sacrificial layer. As with the first contact openings, the second contact openings are provided in the desired contact size and pattern. By way of example, the second contact openings 235 may each have a characteristic dimension less than 500 nanometers, for instance, in the 100-500 nanometer range.

Figure 2H:
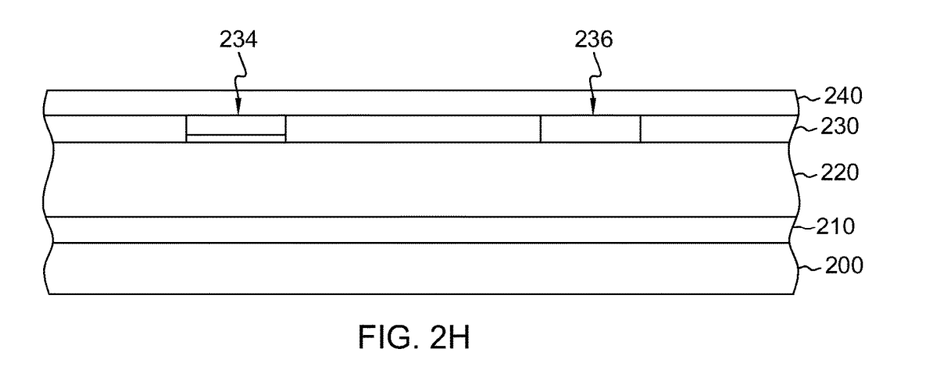

As illustrated in FIG. 2H, a plurality of second discrete contacts 236 are formed within the second contact openings 235 (FIG. 2G) by depositing a desired contact material. In one or more implementations, the second discrete contacts 236 comprise a plurality of ohmic-type discrete contacts to light absorption layer 220. These contacts may be formed by depositing and planarizing an appropriate back-side contact material or materials, such as Mo, ZnO, ZnO:Al, etc., within the second contact openings, after which a metal contact layer 240 is deposited covering the cell stack. Metal contact layer 240 may comprise a conductive and photon-reflective material, such as, for instance, silver or aluminum.

Figure 2I:
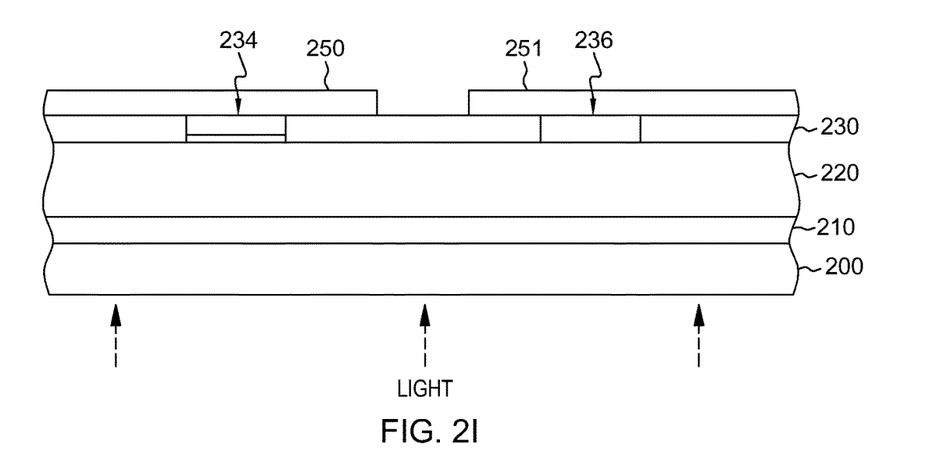
Figure 3:
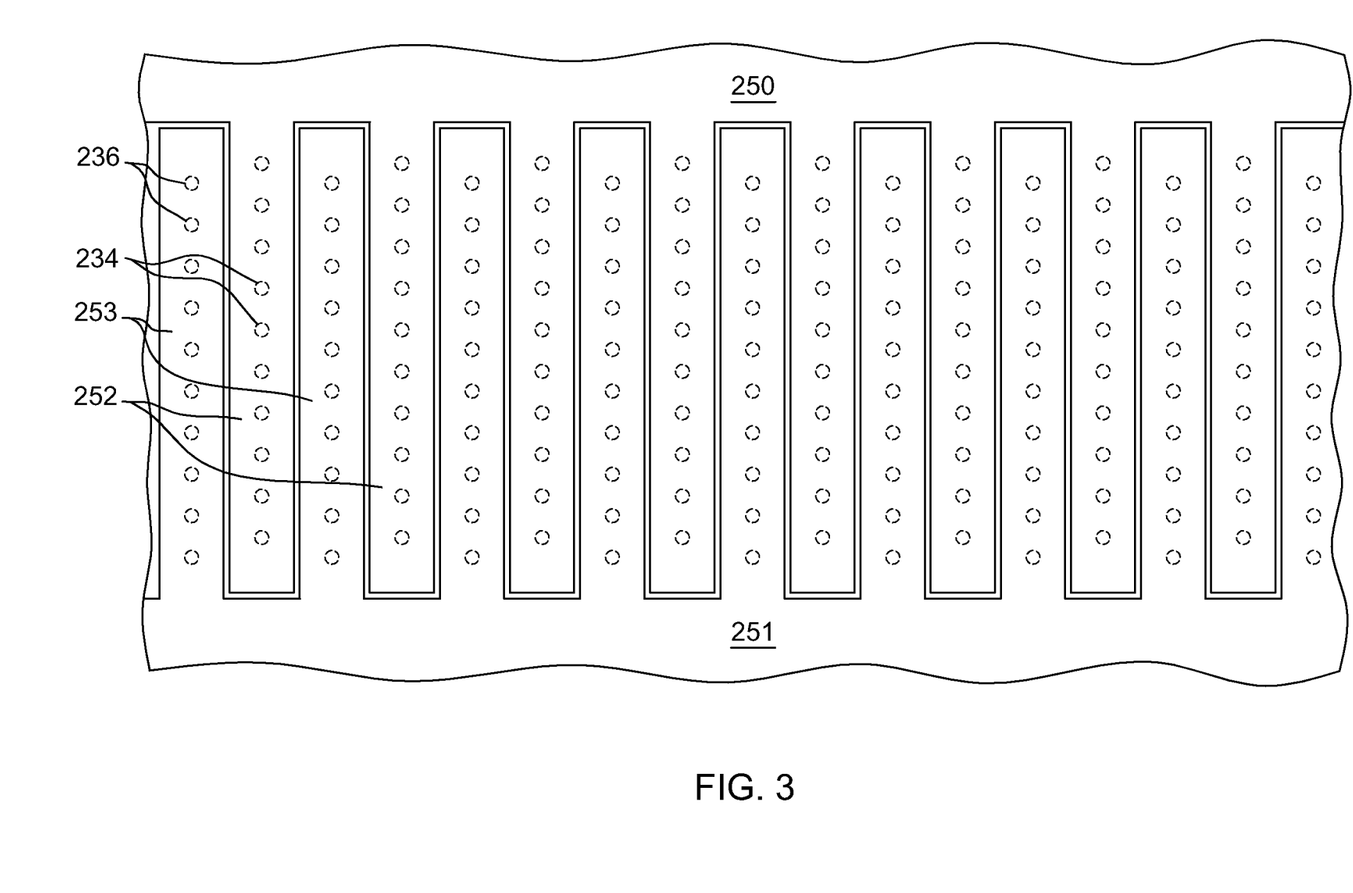
FIG. 3 depicts a plan view of one embodiment of the first and second electrodes of the photovoltaic cell of FIG. 2I, in accordance with one or more aspects of the present invention.

After forming back-side contact layer 240, a third sacrificial layer (not shown) may be provided over back-side contact layer 240, and nano-printed with openings to etch back-side contact layer 240 to form separate, interdigitated electrodes 250, 251, as illustrated in FIG. 2I. In one or more implementations, electrodes 250, 251 cover the majority of second surface passivation layer 230, and thus, the light absorption layer 220. As illustrated in FIG. 3, the electrodes may be patterned in any desired (interdigitated) configuration, and may cover, for instance, a majority, such as 95% or more of the cell.

In the embodiment of FIG. 3, electrodes 250, 251 include respective conductive lines 252, 253, which are interleaved, by way of example. Note that the conductive lines 252 of first electrode 250 overlie, for instance, the plurality of first discrete contacts 234, and conductive lines 253 of second electrode 251 overlie the plurality of second discrete contacts 236. After etching to interdigitate the electrodes (such as shown, for instance, in FIG. 3), interconnection between photovoltaic cell electrodes to form the desired photovoltaic device, module, panel, etc., may be made, and conventional packaging or enclosure may be used to complete the photovoltaic device.

Note that numerous variations on the process steps described above in connection with FIGS. 2A-3 may be employed. For instance, a dielectric layer could be added onto the second surface passivation layer to further improve internal reflection of the light absorption material. In addition, for organic- or inorganic-Perovskite, the second surface passivation layer (or buffer layer) may be replaced by a hole selective contact layer, and the discrete contacts may include nano-sized $TiO_2$ contacts, such as nanowires.

Advantageously, thin film photovoltaic cells are provided herein with both contact types on one side of the light absorption layer, allowing separate optimization of the optical design and electrical design, and removing the requirement for a transparent conducting oxide (TCO) layer, while allowing for improved passivation of the light absorption material surfaces, and allowing simplified electrical interconnection of photovoltaic cells. In accordance with the designs described herein, small, discrete contacts, such as point- or nano-sized contacts (or vias) are provided within a common passivation layer to, for instance, provide ohmic as well as rectifying contacts to the light absorption material. In other embodiments, the contacts may be charge-carrier-selective contacts. The thin film photovoltaic or solar cells described may be beneficially employed for CIGS, CZTS, organic- or inorganic-Perovskite, etc., solar cells. The design of the solar cell is such that the necessary ohmic contacts and heterojunction contacts are formed on one side of the absorber material only. The absorber layer may be enclosed with passivation layers, and light enters into the cell through a light transparent substrate, and is reflected by a highly-reflecting layer outside the passivation layers, such as the first and second electrodes, to further reduce absorption losses. The back-side contacts advantageously substantially cover the cell and provide electrical contact to the solar cell. The back-side electrodes are electrically connected iva the discrete contacts, rows of discrete contacts, lines of contacts, etc., to the light absorption layer. The interfaces to the light absorption material (e.g., p-type material) are functionalized via n-type doping and the ohmic contacts. The contacts may have a pitch of 100 nm-5000 nm, and the contacts may have a characteristic dimension in the range of 100-500 nm, in accordance with the requirements of the lifetime of minority charge carriers and the absorption material.

As noted, the back-side-only photovoltaic cells and manufacturing methods disclosed herein address numerous goals, including, for instance, reducing the thickness of the thin film light absorption layer (i.e., the thin film solar absorber), reducing surface recombination, and increasing photovoltaic cell efficiency. In conventional photovoltaic cells, thinning down of the absorber material is prevented due to the increased absorption and/or recombination at the back contact layer. In a typical photovoltaic cell with a 2-3 μm thick absorber having a typical absorption coefficient, most of the radiation is absorbed while traveling through the material. The red part of the spectrum is able to travel further through the absorber, and is able to get absorbed/reflected in or at the back contact layer (e.g., Mo layer), increasing the chances for carrier losses. As explained herein, since the back contact (e.g., Mo) area is significantly reduced, in accordance with one or more aspects of the present invention, and since recombination is reduced by the presence of the passivation layer, the prior art restriction is overcome. It is less likely that photons will be absorbed and reflected back by a back-side electrode (e.g., Ag electrode), which is a better mirror than an Mo layer. Hence, the absorber thickness can be reduced, while maintaining current generation within the cell, at the same time as keeping high-voltage levels.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A photovoltaic cell comprising:
   a substrate, the substrate being, at least in part, transparent to allow light to enter the photovoltaic cell through the substrate;
   a light absorption layer associated with the substrate, the light absorption layer having opposite first and second surfaces, the first surface being closer to the substrate than the second surface;
   a passivation layer disposed over the second surface of the light absorption layer;
   a plurality of first discrete electrical contacts and a plurality of second discrete electrical contacts, the plurality of first discrete electrical contacts and the plurality of second discrete electrical contacts both residing within and passing through the passivation layer, and both facilitating direct electrical coupling to the light absorption layer; and
   a first electrode and a second electrode disposed over the passivation layer, the first electrode being disposed over and contacting the plurality of first discrete electrical contacts and the second electrode being disposed over and contacting the plurality of second discrete electrical contacts.

2. The photovoltaic cell of claim 1, wherein the light absorption layer comprises a thin film semiconductor material, the thin film semiconductor material having a thickness of 5 microns or less, and comprising one of copper-indium-gallium-selenide (CIGS), copper-zinc-tin-sulfide (CZTS), or a Perovskite material.

3. The photovoltaic cell of claim 2, wherein the plurality of first discrete electrical contacts comprise a plurality of heterojunction-type discrete contacts to the light absorption layer extending through the passivation layer, and the plurality of second discrete electrical contacts comprise a plurality of ohmic-type contacts to the light absorption layer extending through the passivation layer.

4. A photovoltaic cell comprising:
   a substrate, the substrate being, at least in part, transparent to allow light to enter the photovoltaic cell through the substrate;
   a light absorption layer associated with the substrate, the light absorption layer having opposite first and second surfaces, the first surface being closer to the substrate than the second surface;
   a passivation layer disposed over the second surface of the light absorption layer;
   a plurality of first discrete contacts and a plurality of second discrete contacts, the plurality of first discrete contacts and the plurality of second discrete contacts both residing within and passing through the passivation layer, and both facilitating direct electrical coupling to the light absorption layer;
   a first electrode and a second electrode disposed over the passivation layer, the first electrode contacting the plurality of first discrete contacts and the second electrode contacting the plurality of second discrete contacts; and
   wherein the passivation layer is a second surface passivation layer, and wherein the photovoltaic cell further comprises a first surface passivation layer disposed over the first surface of the light absorption layer, between the substrate and the light absorption layer.

5. The photovoltaic cell of claim 4, wherein the first surface passivation layer and second surface passivation layer comprise a common passivation material.

6. The photovoltaic cell of claim 1, wherein the plurality of first discrete electrical contacts and the plurality of second discrete electrical contacts comprise surfaces co-planar with a surface of the passivation layer.

7. The photovoltaic cell of claim 1, wherein the plurality of first discrete electrical contacts comprise a plurality of heterojunction-type discrete contacts to the light absorption layer, and the plurality of second discrete electrical contacts comprise a plurality of ohmic-type discrete contacts to the light absorption layer.

8. The photovoltaic cell of claim 7, wherein the light absorption layer comprises a semiconductor material, the semiconductor material comprising one of copper-indium-gallium-selenide (CIGS), copper-zinc-tin-sulfide (CZTS), or a Perovskite material, and wherein the plurality of heterojunction-type discrete contacts each comprise a buffer material and a transparent conducting oxide, and the plurality of ohmic-type discrete contacts comprise a metal contact to the light absorption layer.

9. The photovoltaic cell of claim 1, wherein the first electrode and second electrode comprise interdigitated first conductive lines and second conductive lines, respectively disposed over the corresponding plurality of first discrete electrical contacts and the corresponding plurality of second discrete electrical contacts.

10. A photovoltaic device comprising:
a photovoltaic cell, the photovoltaic cell comprising:
- a substrate, the substrate being, at least in part, transparent to allow light to enter the photovoltaic cell through a first side of the substrate;
- a light absorption layer associated with the substrate, the light absorption layer having opposite first and second surfaces, the first surface being closer to the substrate than the second surface;
- a first surface passivation layer and a second surface passivation layer, the first surface passivation layer being disposed over the first surface of the light absorption layer, between the substrate and the light absorption layer, and the second surface passivation layer being disposed over the second surface of the light absorption layer;
- a plurality of first discrete contacts and a plurality of second discrete contacts, the plurality of first discrete contacts and the plurality of second discrete contacts both residing within and passing through the second surface passivation layer, and both facilitating direct electrical coupling to the light absorption layer; and
- a first electrode and a second electrode disposed over the second surface passivation layer, the first electrode contacting the plurality of first discrete contacts, and the second electrode contacting the plurality of second discrete contacts.

11. The photovoltaic device of claim 10, wherein first discrete contacts of the plurality of first discrete contacts, and second discrete contacts of the plurality of second discrete contacts each have a characteristic dimension of 500 nanometers or less.

12. The photovoltaic device of claim 10, wherein the plurality of first discrete contacts are a plurality of first contact vias extending through the second surface passivation layer, and the plurality of second discrete contacts are a plurality of second contact vias extending through the second surface passivation layer.

13. The photovoltaic device of claim 10, wherein the plurality of first discrete contacts and the plurality of second discrete contacts comprise surfaces coplanar with a surface of the second surface passivation layer.

14. The photovoltaic device of claim 10, wherein the plurality of first discrete contacts comprise a plurality of heterojunction-type discrete contacts to the light absorption layer, and the plurality of second discrete contacts comprise a plurality of ohmic-type discrete contacts to the light absorption layer.

15. The photovoltaic device of claim 10, wherein the first electrode and the second electrode cover at least 90% of the second surface passivation layer and comprise interdigitated first and second conductive lines, respectively disposed over the corresponding plurality of first discrete contacts and the corresponding plurality of second discrete contacts.

* * * * *